United States Patent
Dong et al.

(10) Patent No.: US 11,446,673 B2
(45) Date of Patent: Sep. 20, 2022

(54) METHOD FOR DESIGNING REFINER PLATES WITH THREE-STAGE RADIAL CURVED BARS

(71) Applicant: Shaanxi University of Science & Technology, Shaanxi (CN)

(72) Inventors: Jixian Dong, Xi'an (CN); Huan Liu, Xi'an (CN); Xiya Guo, Xi'an (CN); Bo Wang, Xi'an (CN); Dong Wang, Xi'an (CN); Hui Jing, Xi'an (CN); Sha Wang, Xi'an (CN); Ruifan Yang, Xi'an (CN)

(73) Assignee: Shaanxi University of Science & Technology, Xi'an (CN)

( * ) Notice: Subject to any disclaimer, the term of this patent is extended or adjusted under 35 U.S.C. 154(b) by 562 days.

(21) Appl. No.: 16/578,222

(22) Filed: Sep. 20, 2019

(65) Prior Publication Data
US 2020/0129985 A1    Apr. 30, 2020

(30) Foreign Application Priority Data
Oct. 30, 2018    (CN) .......................... 201811280609.3

(51) Int. Cl.
*G06F 17/11*      (2006.01)
*B02C 7/12*       (2006.01)
(Continued)

(52) U.S. Cl.
CPC ............. *B02C 7/12* (2013.01); *D21D 1/306* (2013.01); *G06F 17/11* (2013.01); *G06F 30/20* (2020.01)

(58) Field of Classification Search
CPC ................................. G06F 17/11; G06F 30/20
See application file for complete search history.

(56) References Cited

U.S. PATENT DOCUMENTS 1,609,717 A * 12/1926 Holland-Letz ............ B02C 7/12
                                                             241/261.3
1,809,717 A    12/1926 Holland-Letz
(Continued)

FOREIGN PATENT DOCUMENTS

| CN | 202428341 U |    9/2012 |
|---|---|---|
| CN | 205556469 U |    9/2016 |
| CN | 106321506 B | * 6/2020 |

OTHER PUBLICATIONS

Elahimehr Low Consistency Refining of Mechanical Pulp: The Relationship Between Plate Pattern, Operational Variables and Pulp Properties University of British Columbia, Oct. 2014 (Year: 2014).*

(Continued)

*Primary Examiner* — Rehana Perveen
*Assistant Examiner* — Cuong V Luu (57) ABSTRACT

The present invention discloses a method for designing a refiner plate with three-stage radial curved bars, comprising following steps of: designing a circle arc for $1_{st}$ stage radial curved bars; designing a circle arc for the $2_{nd}$ stage radial curved bars; designing a circle arc for $3_{rd}$ stage radial curved bars; and designing a center angle for the refiner plate according to the size of the refiner plate and the manufacture requirements, to complete the design of the refiner plate. In the present invention, by the establishment of equations for the circle arcs and angles of inclination of the curved bars, it is ensured that the width of the bars will not change in the radial direction, and both the flexibility in designing a curved refiner plate and the uniformity of crushing are improved. This design method provides a theory basis and also instructions for designing multi-stage radial curved bars.

6 Claims, 7 Drawing Sheets

(51) Int. Cl.
*D21D 1/30* (2006.01)
*G06F 30/20* (2020.01)

(56) References Cited

U.S. PATENT DOCUMENTS

| | | | |
|---|---|---|---|
| 1,705,379 | A | 3/1929 | Sheppard, Jr. |
| 3,674,217 | A * | 7/1972 | Reinhall .................. D21D 1/30 241/296 |
| 4,023,737 | A | 5/1977 | Leider et al. |
| 7,398,938 | B2 | 7/2008 | Antensteiner |
| 2009/0001204 | A1 | 1/2009 | Antensteiner |
| 2012/0294725 | A1 | 11/2012 | Hackl et al. |
| 2018/0214883 | A1* | 8/2018 | Gingras ................... B02C 7/12 |

OTHER PUBLICATIONS

Cheng-kun et al. Logarithmic Spiral and Its Application in the Design of Refiner Plate Tianjin of Science & Technology, Tianjin (Year: 2015).*

* cited by examiner

METHOD FOR DESIGNING REFINER PLATES WITH THREE-STAGE RADIAL CURVED BARS

CROSS-REFERENCE TO RELATED APPLICATIONS

This application claims the benefit of priority from Chinese Patent Application No. CN 201811280609.3, filed on Oct. 30, 2018. The content of the aforementioned application, including any intervening amendments thereto, is incorporated herein by reference in its entirety.

TECHNICAL FIELD

The present invention belongs to the technical field of designing the bar shape of a refiner plate for a disc refiner, and particularly relates to a method for designing a refiner plate with three-stage radial curved bars.

BACKGROUND OF THE PRESENT INVENTION

The refiner disc, as a direct-acting component of a disc refiner, is used for related material crushing and performance improvement processes, such as pulp refining, nitrocellulose and fine particles. At present, refining plates with straight bars and refining plates with curved bars are commonly known. Refining plates with curved bars are highly favored due to their small angular change in the angle during the interaction of bars on the rotor and stator. However, it is complex in the design of their curves.

Curved bars have been introduced in related foreign patents. For example, a refining plate, having both curved bars that are in radial shape and straight bars, was introduced in U.S. Pat. No. 19,273; radial curved bars that are arranged in a dislocation mode were introduced in U.S. Pat. No. 19,273; small-angle curved bars that are distributed in clusters were introduced in U.S. Pat. No. 71,733; two logarithmic spiral curved bars were introduced in U.S. Pat. No. 7,398,938B and US2009/0001204A1; different types of refiner plates with curved bars were respectively proposed in U.S. Pat. Nos. 120,505, 348,637, U.S. Pat. Nos. 1,609,717 and 1,705,379, but no method for designing the bar shape was introduced in those patents; a refiner plate with multi-stage curved bars that are arranged in a dislocation mode was introduced in U.S. Pat. No. 499,714, wherein there are total four stages of bars, the starting part of the $1_{st}$ stage bars is stepped, and the width of the designed bars gradually decreases from inside to outside, but the design method and the definition of curved bars had not yet been explained; a specific curved bar was discussed in U.S. Pat. No. 1,609,717, wherein the feed of material is done by the edge of the bar; a refiner plate with curved bars, which has a retaining wall, the radian of which gradually increases in the radius direction and which is used for pulping, was introduced in U.S. Pat. No. 3,674,217, by this refiner plate, the cutting-off of fibers is reduced, the compression of fibers by the refiner plate is enhanced so that the grinding zone is full of pulp, and the service life of the refiner plate is prolonged; are fining plate with both straight bars and curved bars, which is used for refining of wood pulp for papermaking, was proposed in U.S. Pat. No. 4,023,737, wherein a curved zone consists of continuous circular curves and has a constant channel cross-sectional area and circle centers of the curved bars are concentrated at the center of the construction circle, but this design fails to ensure that both the width of the bars and the width of the channels will not change in the radial direction; and a dislocated curved disk for the treatment of polymers was proposed in US2012/0294725A1, wherein the curved bars are not rectangular, and the degree of inclination of the curved bars are represented by an included angle between the tangent line of the starting circle arc and the radius direction and an included angle between the tangent line of the ending circle arc and the radius direction. Curved bars also have been introduced in Chinese patents. For example, a cement refining plate, on which first and second radial curved bars are arranged, was proposed in CN205556469; and a diamond plate with curved bars was proposed in CN202428341U. None of those patents involves curved bars that are spaced apart at an equal distance or proposes ideas about how to represent the angle of inclination of the curved bars. There is little or no description of the design of the curved bars.

With regard to the three-stage curved bars, by dividing the bars into stages, the refining zone is divided into a crushing zone, a coarse refining zone and a fine refining zone. As the representative of typical curved bars, studies on the design of the three-stage curved bars are of great significance and facilitate the design of multi-stage radial curved bars. How to design curved bars was less studied both in China and abroad. Compared with straight bars, the definition of the angle of inclination of curved bars is complex. If the angle of inclination of curved bars can be defined correctly and the correct equation of the circle arcs can be found, the efficiency of designing curved bars can be improved greatly.

SUMMARY OF THE PRESENT INVENTION

An objective of the present invention is to provide a method for designing a refiner plate with three-stage radial curved bars. By appropriately defining the angle of inclination and the starting angle of inclination of the curved bars and using correct polar coordinates, curve equations are established for the center lines for three-stage bars and for the edges of the curved bars, and the flexibility in designing three-stage radial curved bars is improved.

The present invention is implemented by the following technical solutions.

A method for designing a refiner plate with three-stage radial curved bars is provided, comprising following steps of:

1) designing a circle arc for $1_{st}$ stage radial curved bars: defining an angle of inclination of the $1_{st}$ stage curved bars, establishing a center circle arc for the $1_{st}$ stage curved bars by the angle of inclination of the $1_{st}$ stage curved bars and a starting position, and establishing an equation of circle arcs for the $1_{st}$ stage curved bars;

2) designing a circle arc for the $2_{nd}$ stage radial curved bars: defining an angle of inclination of the $1_{st}$ stage curved bars and a radius of a circle where the $2_{nd}$ stage curved bars start, dividing the refiner disc into zones, establishing an equation of circle arcs for the $2_{nd}$ stage curved bars, and uniformly distributing the $2_{nd}$ stage bars between the adjacent $1_{st}$ stage bars;

3) designing a circle arc for $3_{rd}$ stage radial curved bars: defining an angle of inclination of the $3_{rd}$ stage curved bars and a radius of a circle where the $3_{rd}$ stage curved bars start, dividing the refiner plate into zones, establishing an equation of circle arcs for the $3_{rd}$ stage curved bars, and uniformly distributing the $3_{rd}$ stage bars between the $1_{st}$ stage bars and the $2_{nd}$ stage bars or between the adjacent $2_{nd}$ stage bars;

4) designing a center angle for the segment according to the size of the refiner plates and the manufacture requirements, to complete the design of the refiner plate; and 5) machining such a refiner plate in accordance with methods for common refiner discs, mainly including: casting which is applicable for industrial mass-production of refiner plates and milling which is applicable for experimental refiner plates, with casting including following operations as main steps: design and development of a grinding element mold, manufacture of a cavity suitable for casting, alloy smelting and casting, opening the mold for the purpose of cleaning (sand cleaning, de-gating), initial machining, thermal treatment, finish machining, and inspection and the like.

Further, the step 1) comprises following steps of:

step 1: defining an angle of inclination of the $1_{st}$ stage curved bars:

given that the refiner plate has an inner diameter $R_i$, an outer diameter $R_o$ and a circle center O, a center circle in the refining zone has a radius $(R_i+R_o)/2$, OB is a vertical bisector of the refining zone, and the center circle in the refining zone intersects with OB at a point B, making BE passing through the point B at the top left of OB if the curved bars are left-hand bars and making BE passing through the point B at the top right of OB if the curved bars are right-hand bars, with an included angle between BE and OB being represented by β, the value of which is preset;

selecting any point A from an inner circle in the refining zone, and making a circle passing through the points A and B by using BE as a tangent line, with a line perpendicular to the tangent line BE and a line perpendicular to AD intersecting at a point $O_1$ that is the center of the circle which passes through the points A and B and is tangent to both BE and AD, the radius of the circle $O_1$ being measured as $R_a$; and obtaining an intersected portion of the circle $O_1$ with inner and outer circles in the refining zone as a center line for curved bars, and assuming that an included angle β between BE and OB is the angle of inclination of the $1_{st}$ stage curved bars and an included angle α between AD and OA is a starting angle of inclination of the $1_{st}$ stage curved bars;

step 2: designing an equation of the center circle arc for the $1_{st}$ stage curved bars:

obtaining an equation of the circle $O_1$, by using the point $O_1$ as a pole and drawing a horizontal ray from the pole as a polar axis, using the counterclockwise direction as the positive direction, and representing an included angle between a connecting line from any one point on the circle $O_1$ to the pole, and the polar axis as θ:

$$\begin{cases} x = R_a\cos\theta \\ y = R_a\sin\theta \end{cases} \quad (1)$$

wherein the equation (1) is the equation of the circle of the center circle arc AC for the $1_{st}$ stage curved bars;

step 3: designing equations for inner and outer circle arcs for the $1_{st}$ stage bars:

given that the width of the $1_{st}$ stage curved bars is b, respectively representing equations for inner and outer circle arcs for the $1_{st}$ stage bars as:

$$\begin{cases} x = \left(R_a + \frac{b}{2}\right)\cos\theta \\ y = \left(R_a + \frac{b}{2}\right)\sin\theta \end{cases} \text{ and } \begin{cases} x = \left(R_a - \frac{b}{2}\right)\cos\theta \\ y = \left(R_a - \frac{b}{2}\right)\sin\theta \end{cases} \quad (2)$$

step 4: distributing n $1_{st}$ stage curved bars according to the size of the refiner plate and the process requirements, and shaping edges of the established $1_{st}$ stage bars in a circular pattern, to finally complete the curved design of the $1_{st}$ stage radial curved bars.

Further, the step 2) comprises following steps of:

step 1: defining an angle of inclination of the $2_{nd}$ stage curved bars:

given that a starting circle for the $2_{nd}$ stage curved bars has a radius $R_1$ and the starting circle for the $2_{nd}$ stage curved bars intersects with two adjacent center circle arcs for the $1_{st}$ stage bars at points F and G, and given that a center circle in a zone where the $2_{nd}$ stage curved bars are located has a radius $(R_1+R_o)/2$ and the center circle intersects with two adjacent center circle arcs for the $1_{st}$ stage bars at points H and I, equally dividing FG and HI into m parts with each equal diversion point being a starting point $A_i$ and an intermediate point $B_i$ for the $2_{nd}$ stage curved bars, making $B_iE_i$ passing through the intermediate point $B_i$, connecting $OA_i$ and $OB_i$ to obtain an included angle $β_i$ between $B_iE_i$ and $OB_i$, and making a circle $O_i$ passing through the points $A_i$ and $B_i$ by using BE as a tangent line, the radius of the circle $O_i$ being measured as $R_b$; and making a tangent line $A_iD_i$ passing through $A_i$, which is tangent to the circle $O_i$, with an included angle $α_i$ between $A_iD_i$ and $OA_i$ being the starting angle of inclination of the $2_{nd}$ stage curved bars and an included angle $β_i$ between $B_iE_i$ and $OB_i$ being the angle of inclination of the $2_{nd}$ stage curved bars;

step 2: designing an equation of the center circle arc for the $2_{nd}$ stage curved bars:

obtaining an equation of the center circle arc for the $2_{nd}$ stage curved bars, by using the point $O_i$ as a pole and drawing a horizontal ray from the pole as a polar axis, using the counterclockwise direction as the positive direction, and representing an included angle between a connecting line from any one point on the circle $O_i$ to the pole, and the polar axis as $θ_1$:

$$\begin{cases} x = R_b\cos\theta_1 \\ y = R_b\sin\theta_1 \end{cases} \quad (3)$$

step 3: designing equations for inner and outer circle arcs for the $2_{nd}$ stage bars:

given that the width of the $2_{nd}$ stage curved bars is a, respectively representing equations for inner and outer circle arcs for the $2_{nd}$ stage bars as:

$$\begin{cases} x = \left(R_b + \frac{a}{2}\right)\cos\theta_1 \\ y = \left(R_b + \frac{a}{2}\right)\sin\theta_1 \end{cases} \text{ and } \begin{cases} x = \left(R_b - \frac{a}{2}\right)\cos\theta_1 \\ y = \left(R_b - \frac{a}{2}\right)\sin\theta_1 \end{cases} \quad (4)$$

step 4: according to the number n of the $1_{st}$ stage curved bars, shaping edges of the $2_{nd}$ stage bars in a circular pattern, with the number of the $2_{nd}$ stage bars being n(m−1), to finally complete the curved design of the $2_{nd}$ stage radial curved bars.

Further, the step 3) comprises following steps of:

step 1: defining an angle of inclination of the $3_{rd}$ stage curved bars:

given that a starting circle for the $3_{rd}$ stage curved bars has a radius $R_2$ and the starting circle for the $3_{rd}$ stage curved bars intersects with two adjacent center circle arcs for the $1_{st}$ stage bars or with adjacent center circle arcs for the $1_{st}$ stage and $2_{nd}$ stage curved bars at points J and K, and given that a center circle in a zone where the $3_{rd}$ stage curved bars are located has a radius $(R_2+R_o)/2$ and the center circle intersects with two adjacent center circle arcs for the $2_{nd}$ stage bars or with adjacent center circle arcs for the $1_{st}$ stage and $2_{nd}$ stage curved bars at points M and N, equally dividing JK and MN into z parts with each equal diversion point being a starting point $A_x$ and an intermediate point $B_x$ for the $3_{rd}$ stage curved bars, making $B_xE_x$ passing through the intermediate point $B_x$, connecting $OA_x$ and $OB_x$ to obtain an included angle $\beta_x$ between $B_xE_x$ and $OB_x$, and making a circle $O_x$ passing through the point $A_x$ by using $B_xE_x$ as a tangent line, the radius of the circle $O_x$ being measured as $R_c$; and making a tangent line $A_xD_x$ passing through $A_x$, which is tangent to the circle $O_x$, with an included angle $\alpha_x$ between $A_xD_x$ and $OA_x$ being the starting angle of inclination of the $3_{rd}$ stage curved bars and an included angle $\beta_i$ between $B_iE_i$ and $OB_i$ being the angle of inclination of the $3_{rd}$ stage curved bars;

step 2: designing an equation of the center circle arc for the $3_{rd}$ stage curved bars:

obtaining an equation of the center circle arc for the $3_{rd}$ stage curved bars, by using the point $O_x$ as a pole and drawing a horizontal ray from the pole as a polar axis, using the counterclockwise direction as the positive direction, and representing an included angle between a connecting line from any one point on the circle $O_x$ to the pole, and the polar axis as $\theta_2$:

$$\begin{cases} x = R_c\cos\theta_2 \\ y = R_c\sin\theta_2 \end{cases} \quad (5)$$

step 3: designing equations for inner and outer circle arcs for the $3_{rd}$ stage bars:

given that the width of the $3_{rd}$ stage curved bars is c, respectively representing equations for inner and outer circle arcs for the $3_{rd}$ stage bars as:

$$\begin{cases} x = \left(R_c + \frac{c}{2}\right)\cos\theta_2 \\ y = \left(R_c + \frac{c}{2}\right)\sin\theta_2 \end{cases} \text{ and } \begin{cases} x = \left(R_c - \frac{c}{2}\right)\cos\theta_2 \\ y = \left(R_c - \frac{c}{2}\right)\sin\theta_2 \end{cases} \quad (6)$$

step 4: according to the number n of the $1_{st}$ stage curved bars and the number n(m−1) of the $2_{nd}$ stage curved bars, shaping edges of the $3_{rd}$ stage bars in a circular pattern, with the number of the $3_{rd}$ stage bars being nm(z−1), to finally complete the curved design of the $3_{rd}$ stage radial curved bars.

Further, the angle of inclination of the $1_{st}$ stage curved bars is less than that of the $2_{nd}$ stage curved bars, and the angle of inclination of the $2_{nd}$ stage curved bars is less than that of the $3_{rd}$ stage curved bars.

Further, the angle of inclination of the $1_{st}$ stage curved bars, the angle of inclination of the $2_{nd}$ stage curved bars or the angle of inclination of the $3_{rd}$ stage curved bars ranges from 35° to 55°.

Further, when the refiner disc is manufactured by division, the bar shape of the grinding elements is designed on a designed refiner disc according to a desired angle γ of the grinding elements, 360/γ grinding elements are shaped in a circular pattern, and the whole refiner disc is thus formed.

Compared with the prior art, the present invention has the following beneficial effects:

By the method for designing a refiner plate with three-stage radial curved bars disclosed in the present invention, the problem that it is unable to measure the angle of inclination of curved bars on a disc refiner is solved. By defining the angle of inclination and the starting angle of inclination of the center circle arcs for the bars, the angle of inclination and the position of the curved bars on the grinding elements are reflected and determined. A method for selecting a starting point of the $2_{nd}$ and $3_{rd}$ stage bars and a midpoint of the circle arc is proposed, so that the position thereof may be traced. Equations are established for the circles where the center circle arcs for three-stage bars and for the circle arcs at the edges of the center bars are located, so that the determination of the circle arcs for the three-stage radial curved bars is more flexible and the design process is simplified.

Further, the present invention discloses a specific curve equation for designing $1_{st}$ curved bars, a specific curve equation for designing $2_{nd}$ curved bars, and a specific curve equation for designing $3_{rd}$ curved bars. An equation of the circle where circle arcs beside the center curved bars are located is derived from the width of bars. The design of refiner plate is then completed by a patterning process. The relationship with the number of three-stage bar patterns is provided. Various parameters of a refining plate to be designed may be substituted into the equations. In this way, a desired three-stage radial refiner disc can be designed quickly.

Further, the design idea when the refiner plate is to be manufactured by division is provided, to meet various actual requirements. Methods and embodiments for actually machining a refiner plate are provided. For a refining plate designed according to the present invention, it is ensured that the width of the bars will not change in the radial direction. Both the flexibility in designing a curved refiner plate and the uniformity of crushing are improved. This design method provides a theory basis and also instructions for designing multi-stage radial curved bars.

DETAILED DESCRIPTION OF THE PRESENT INVENTION

The present invention will be further described below by specific embodiments. The description is merely provided for explaining the present invention, rather than limiting the present invention.

The method for designing a refiner plate with three-stage radial curved bars according to the present invention comprises following steps of:

1) designing a circle arc for $1_{st}$ stage radial curved bars: defining an angle of inclination of the $1_{st}$ stage curved bars, establishing a center circle arc for the $1_{st}$ stage curved bars by the angle of inclination of the $1_{st}$ stage curved bars and a starting position, and establishing an equation of circle arcs for the $1_{st}$ stage curved bars;

2) designing a circle arc for the $2_{nd}$ stage radial curved bars: defining an angle of inclination of the $1_{st}$ stage curved bars and a radius of a circle where the $2_{nd}$ stage curved bars start, dividing the refiner plate into zones, establishing an equation of circle arcs for the $2_{nd}$ stage curved bars, and uniformly distributing the $2_{nd}$ stage bars between the adjacent $1_{st}$ stage bars;

3) designing a circle arc for $3_{rd}$ stage radial curved bars: defining an angle of inclination of the $3_{rd}$ stage curved bars and a radius of a circle where the $3_{rd}$ stage curved bars start, dividing the refiner plate into zones, establishing an equation of circle arcs for the $3_{rd}$ stage curved bars, and uniformly distributing the $3_{rd}$ stage bars between the $1_{st}$ stage bars and the $2_{nd}$ stage bars or between the adjacent $2_{nd}$ stage bars;

4) designing a center angle for the refiner disc according to the size of the refiner disc and the manufacture requirements, to complete the design of the refiner plate; and 5) machining such a refiner plate in accordance with methods for common refiner plates, mainly including: casting which is applicable for industrial mass-production of refiner discs and milling which is applicable for experimental refiner plates, with casting including following operations as main steps: design and development of a refining plate mold, manufacture of a cavity suitable for casting, alloy smelting and casting, opening the mold for the purpose of cleaning (sand cleaning, de-gating), initial machining, thermal treatment, finish machining, and inspection and the like.

Figure 1:
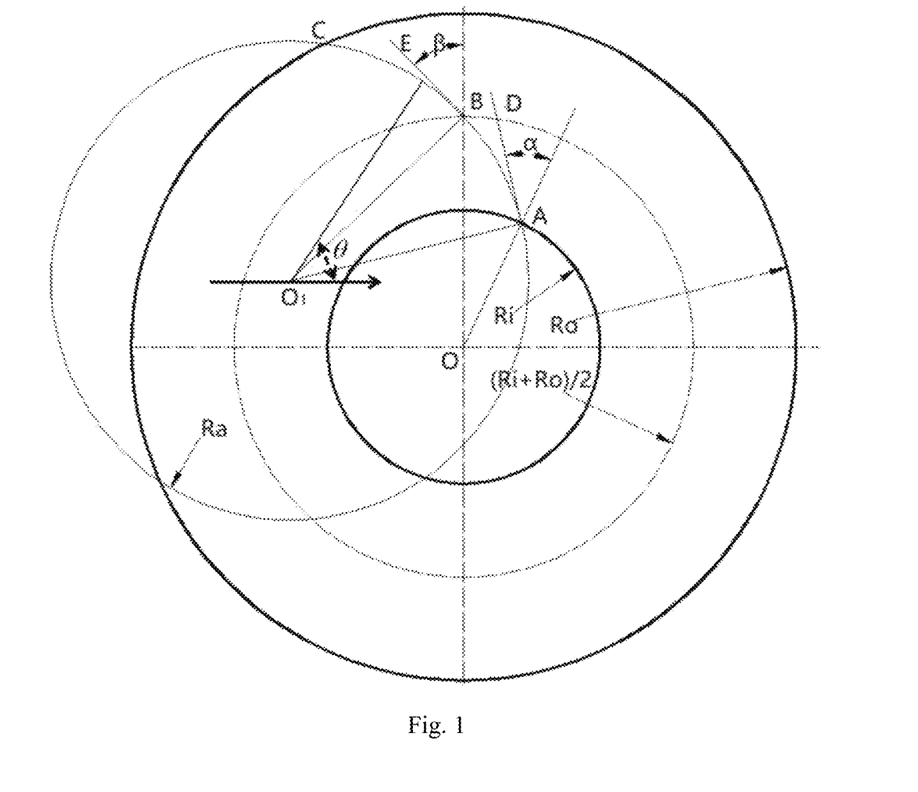
FIG. 1 is a schematic view of determining a center circle arc of the angle of inclination of the $1_{st}$ curved bars.

1. The design of the circle arc of the angle of inclination of the $1_{st}$ stage curved bars specifically comprises following steps.

As shown in FIG. 1, given that the refiner disc with three-stage radial curved bars has an inner diameter $R_i$, an outer diameter $R_o$ and a circle center O, a center circle in the grinding zone has a radius $(R_i+R_o)/2$, OB is a vertical bisector of the refining plate, and the center circle in the refining plate intersects with OB at a point B, BE passing through the point B is made at the top left of OB if the curved bars are left-hand bars and BE passing through the point B is made at the top right of OB if the curved bars are right-hand bars. An included angle between BE and OB is represented by β, the value of which is preset.

A circle passing through the points A and B is made by using BE as a tangent line. According to the law of the tangent line of a circle, a line perpendicular to the tangent line BE and a line perpendicular to AD intersect at a point $O_1$ that is the center of the circle which passes through the points A and B and is tangent to both BE and AD. The radius of the circle $O_1$ is measured as $R_a$.

An intersected portion of the circle $O_1$ with inner and outer circles in the grinding zone is obtained as a center line for curved bars. It is assumed that an included angle β between BE, which is tangent to the center line of the circle arc at the point B, and OB, which contains the point B in the radius direction, is the angle of inclination of the $1_{st}$ stage curved bars; and, an included angle α between AD, which is tangent to the circle $O_1$ at the point A, and OA is a starting angle of inclination of the $1_{st}$ stage curved bars.

An equation of the circle $O_1$ is obtained, by using the point $O_1$ as a pole and drawing a horizontal ray $O_x$ from the pole as a polar axis, using the counterclockwise direction as the positive direction, and representing an included angle between a connecting line from any one point on the circle $O_1$ to the pole, and the polar axis as θ:

$$\begin{cases} x = R_a\cos\theta \\ y = R_a\sin\theta \end{cases} \quad (1)$$

wherein the equation (1) is the equation of the circle of the center circle arc AC for the $1_{st}$ stage curved bars.

Figure 2:
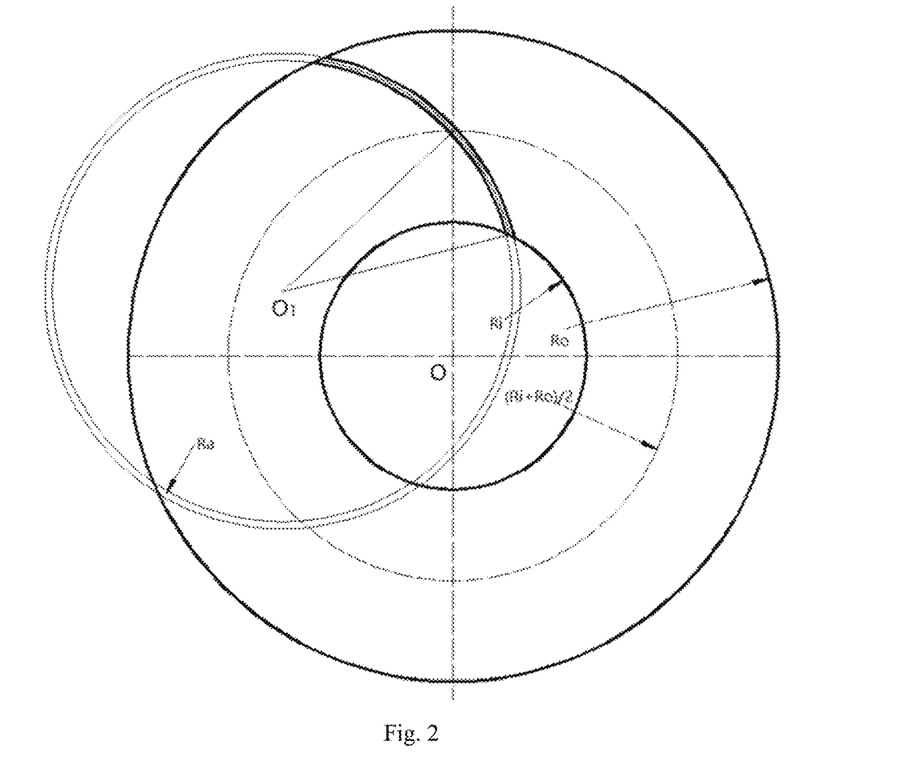
FIG. 2 is a schematic view of establishing curves at the edges of the $1_{st}$ curved bars.
Figure 3:
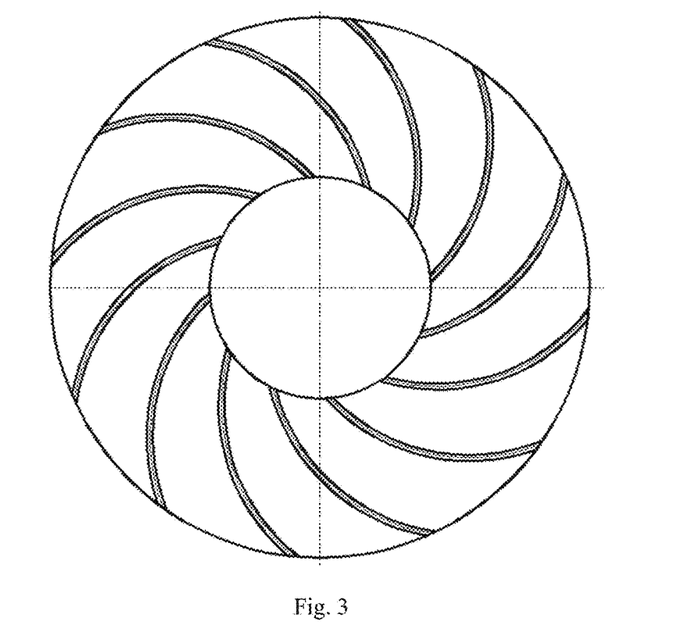
FIG. 3 is a schematic view after shaping the edges of the $1_{st}$ curved bars in a circular pattern.

As shown in FIG. 2, given that the width of the $1_{st}$ stage curved bars is b, equations for inner and outer circle arcs for the $1_{st}$ stage bars are respectively represented as:

$$\begin{cases} x = \left(R_a + \dfrac{b}{2}\right)\cos\theta \\ y = \left(R_a + \dfrac{b}{2}\right)\sin\theta \end{cases} \text{ and } \begin{cases} x = \left(R_a - \dfrac{b}{2}\right)\cos\theta \\ y = \left(R_a - \dfrac{b}{2}\right)\sin\theta \end{cases} \quad (2)$$

the number $1_{st}$ stage curved bars are appropriately distributed according to the size of the refining plate and the process requirements, and edges of the established $1_{st}$ stage bars are shaped in a circular pattern, to finally obtain a refiner plate with one-stage curved bars as shown in FIG. 3.

Figure 4:
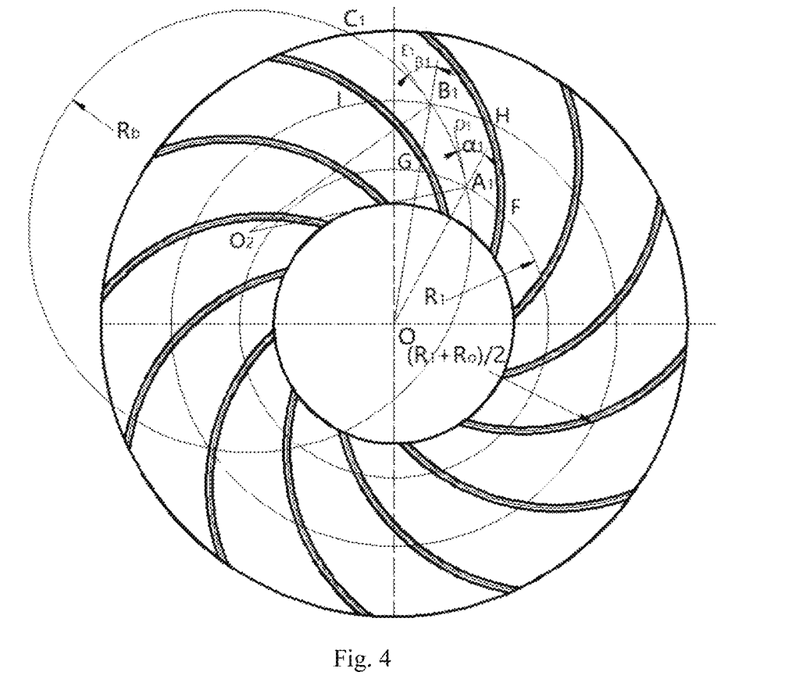
FIG. 4 is a schematic view of determining a center circle arc of the angle of inclination of the $2_{nd}$ curved bars.

2. The design of the circle arc of the angle of inclination of the $2_{nd}$ stage curved bars specifically comprises following steps.

As shown in FIG. 4, given that a starting circle for the $2_{nd}$ stage curved bars has a radius $R_1$ and the starting circle intersects with two adjacent center circle arcs for the $1_{st}$ stage bars at points F and G, and given that a center circle in a zone where the $2_{nd}$ stage curved bars are located has a radius $(R_1+R_o)/2$ and the center circle intersects with adjacent center circle arcs for the $1_{st}$ stage bars at points H and I, FG and HI are equally divided into m parts with each equal diversion point being a starting point and an intermediate point for the $2_{nd}$ stage curved bars.

As shown in FIGS. 4, FG and HI are equally divided into two parts, with each equal diversion point being a starting point $A_1$ and an intermediate point $B_1$ for the $2_{nd}$ stage curved bars. $B_1E_1$ passing through the corresponding equal diversion point $B_1$ is made. $OA_1$ and $OB_1$ are connected to obtain an included angle $\beta_1$ between $B_1E_1$ and $OB_1$. A circle $O_2$ passing through the point $A_1$ is made by using $B_1E_1$ as a tangent line. The radius of the circle $O_2$ is measured as $R_b$. A tangent line $A_1D_1$ passing through $A_1$, which is tangent to the circle $O_2$, is made, and then the starting angle of inclination is $\alpha_1$. An equation of the center line for the $2_{nd}$ stage curved bars is obtained, by using the point $O_2$ as a pole and drawing a horizontal ray $O_x$ from the pole as a polar axis, using the counterclockwise direction as the positive direction, and representing an included angle between a connecting line from any one point on the circle $O_2$ to the pole, and the polar axis as $\theta_1$:

$$\begin{cases} x = R_b \cos\theta_1 \\ y = R_b \sin\theta_1 \end{cases} \quad (3)$$

Figure 5:
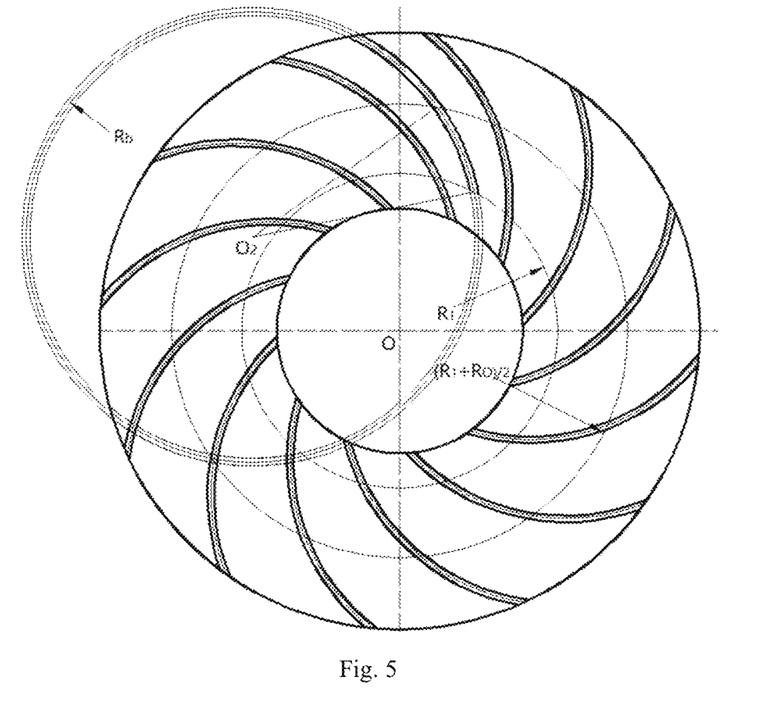
FIG. 5 is a schematic view of establishing curves at the edges of the $2_{nd}$ curved bars.

As shown in FIG. 5, given that the width of the $2_{nd}$ stage curved bars is a, equations for inner and outer circle arcs for the $2_{nd}$ stage bars are respectively represented as:

$$\begin{cases} x = \left(R_b + \frac{a}{2}\right)\cos\theta_1 \\ y = \left(R_b + \frac{a}{2}\right)\sin\theta_1 \end{cases} \text{ and } \begin{cases} x = \left(R_b - \frac{a}{2}\right)\cos\theta_1 \\ y = \left(R_b - \frac{a}{2}\right)\sin\theta_1 \end{cases} \quad (4)$$

Figure 6:
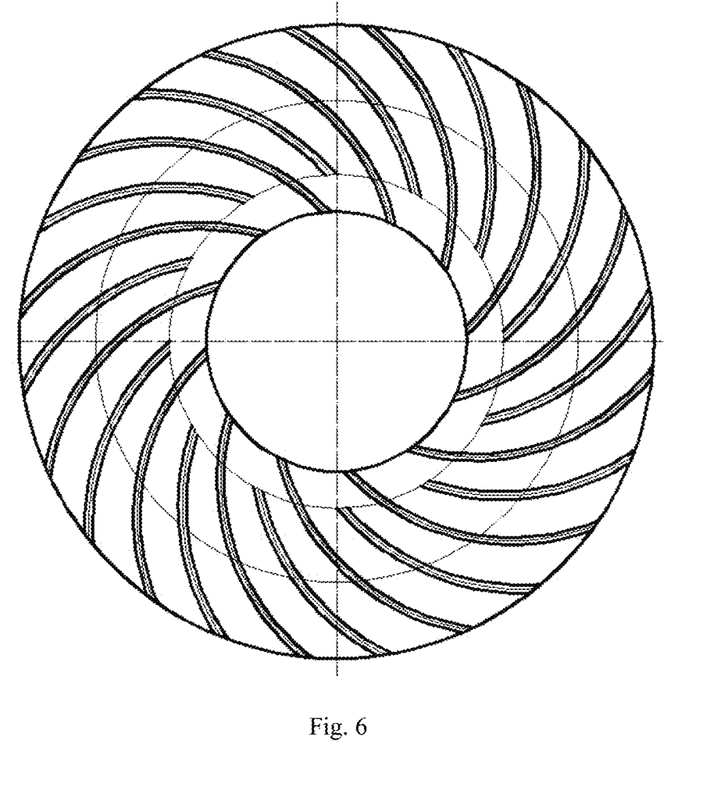
FIG. 6 is a schematic view after shaping the edges of the $2_{nd}$ curved bars in a circular pattern.

According to the number n of the $1_{st}$ stage curved bars, edges of the $2_{nd}$ stage bars are shaped in a circular pattern, with the number of the $2_{nd}$ stage bars being n(m−1), to finally obtain a refiner disc with two-stage curved bars as shown in FIG. 6.

Figure 7:
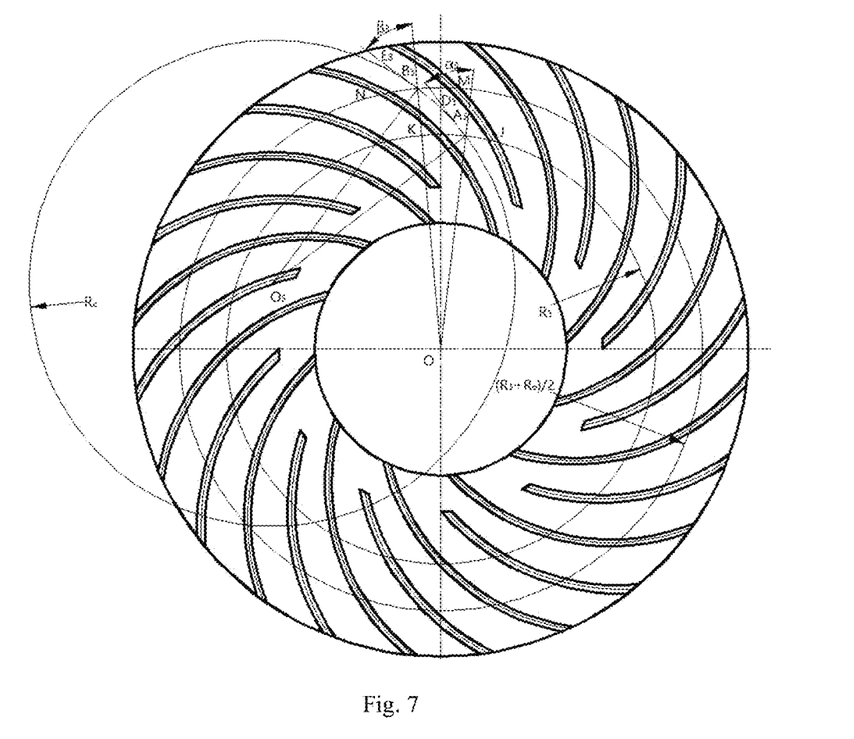
FIG. 7 is a schematic view of determining a center circle arc of the angle of inclination of the $3_{rd}$ curved bars.

3. The design of the circle arc of the angle of inclination of the $3_{rd}$ stage curved bars specifically comprises following steps.

As shown in FIG. 7, given that a starting circle for the $3_{rd}$ stage curved bars has a radius $R_2$ and the starting circle intersects with two adjacent center circle arcs for the $1_{st}$ stage bars at points J and K, and given that a center circle in a zone where the $3_{rd}$ stage curved bars are located has a radius $(R_2+R_o)/2$ and the center circle intersects with two adjacent center circle arcs for the $2_{nd}$ stage bars or with adjacent center circle arcs for the $1_{st}$ stage and $2_{nd}$ stage curved bars at points M and N, JK and MN are equally divided into z parts with each equal diversion point being a starting point and an intermediate point for the $3_{rd}$ stage curved bars.

As shown in FIGS. 7, JK and MN are equally divided into two parts, with each equal diversion point being a starting point $A_3$ and an intermediate point $B_3$ for the $3_{rd}$ stage curved bars. $B_3E_3$ passing through the equal diversion point $B_3$ is made. $OA_3$ and $OB_3$ are connected to obtain an included angle $\beta_3$ between $B_3E_3$ and $OB_3$. A circle $O_3$ passing through the point $A_3$ is made by using $B_3E_3$ as a tangent line. The radius of the circle $O_3$ is measured as $R_c$. A tangent line $A_3D_3$ passing through $A_3$, which is tangent to the circle $O_3$, is made, and then the starting angle of inclination is $\alpha_3$. An equation of the center line for the $2_{nd}$ stage curved bars is obtained, by using the point $O_3$ as a pole and drawing a horizontal ray $O_x$ from the pole as a polar axis, using the counterclockwise direction as the positive direction, and representing an included angle between a connecting line from any one point on the circle $O_3$ to the pole, and the polar axis as $\theta_2$:

$$\begin{cases} x = R_c \cos\theta_2 \\ y = R_c \sin\theta_2 \end{cases} \quad (5)$$

Figure 8:
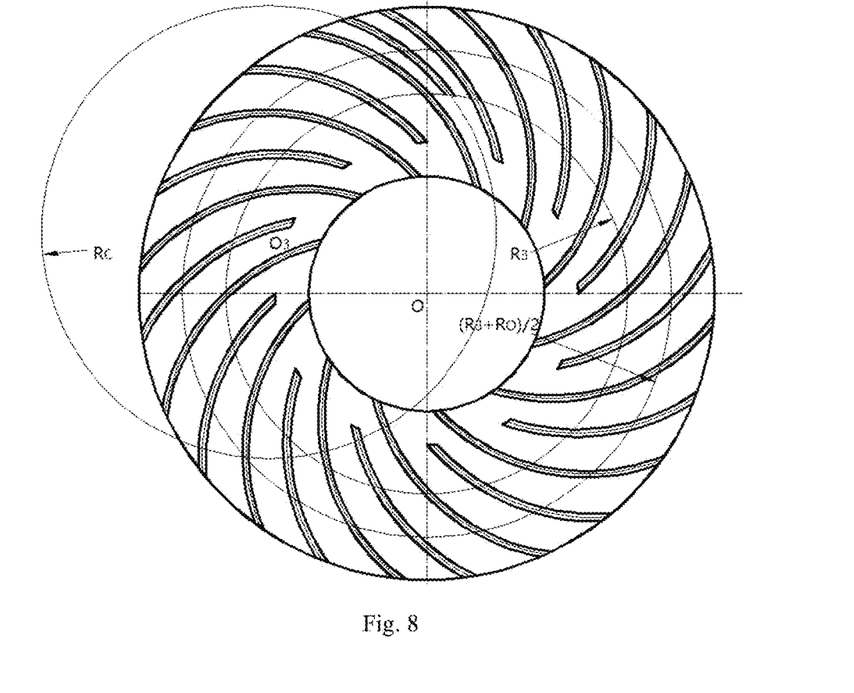
FIG. 8 is a schematic view of establishing curves at the edges of the $3_{rd}$ curved bars.

As shown in FIG. 8, given that the width of the $3_{rd}$ stage curved bars is c, equations for inner and outer circle arcs for the $3_{rd}$ stage bars are respectively represented as:

$$\begin{cases} x = \left(R_c + \frac{c}{2}\right)\cos\theta_2 \\ y = \left(R_c + \frac{c}{2}\right)\sin\theta_2 \end{cases} \text{ and } \begin{cases} x = \left(R_c - \frac{c}{2}\right)\cos\theta_2 \\ y = \left(R_c - \frac{c}{2}\right)\sin\theta_2 \end{cases} \quad (6)$$

Figure 9:
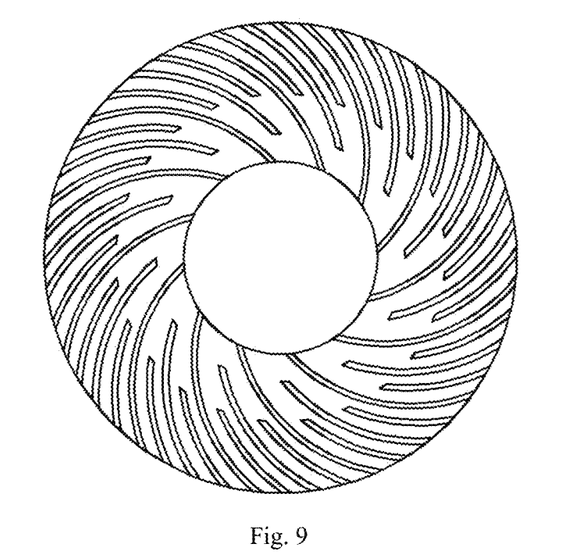
FIG. 9 is a schematic view after shaping the edges of the $3_{rd}$ curved bars in a circular pattern.

According to the number n of the $1_{st}$ stage curved bars and the number n(m−1) of the $2_{nd}$ stage curved bars, edges of the $3_{rd}$ stage bars are shaped in a circular pattern, with the number of the $3_{rd}$ stage bars being nm(z−1), to finally obtain a refiner plate with three-stage curved bars as shown in FIG. 9.

In the step 4, the division of segments of refiner plate.

Figure 10:
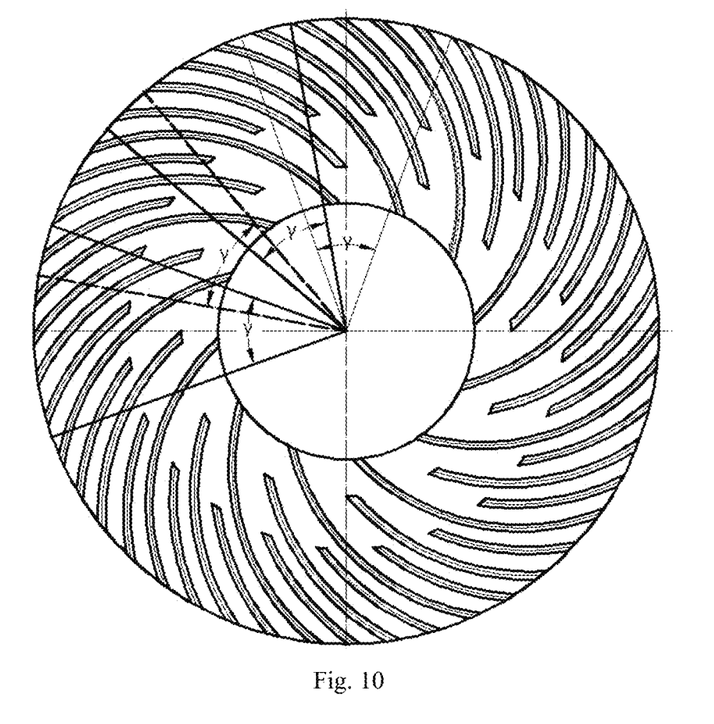
FIG. 10 is a schematic view of designing a grinding element with three-stage radial curved bars.
Figure 11:
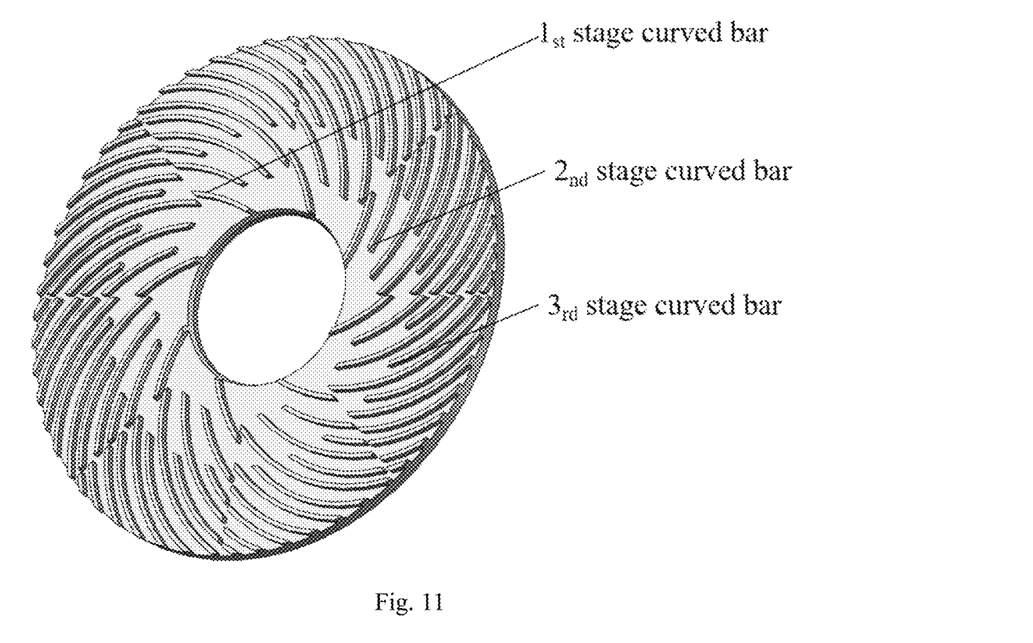
FIG. 11 is a schematic view of a refiner disc spliced from refining plates with three-stage radial curved bars.

In a refiner plate with radial curved bars, since curved bars in a same stage have a same angle of inclination and they are uniformly distributed on the circumference, dividing the refiner plate will not influence the trend of the distribution of the bars. However, since the integrated manufacturing of some refiner plates is complex due to their large diameter, as show in FIGS. 10 and 11, those refiner plates are generally manufactured by division. A drawn grinding element may be further cut according to a desired angle $\gamma$ of the grinding elements. By appropriately designing the bar shape of the refining plate, $360/\gamma$ segments are shaped in a circular pattern. The whole refiner plate is thus formed.

During the practical design process, it should be ensured that the $1_{st}$ stage curved bars have a minimum angle of inclination, followed by the $2_{nd}$ stage curved bars and finally the $3_{rd}$ stage curved bars. Generally, the angle of inclination of the bars ranges from 35° to 55°.

Similarly, the design method may be applicable to the curve equations of multi-stage curved bars.

The specific embodiment will be described below.

Papermaking disc refiners are important devices used in the pulping process. Now, it is required to design a refiner plate with three-stage radial curved bars, which has an inner diameter of 100 mm and an outer diameter of 300 mm. The angle of inclination of the $1_{st}$ stage curved bars is 45°, the angle of inclination of the $2_{nd}$ stage curved bars is 30°, and the angle of inclination of the $3_{rd}$ stage curved bars is 30°. The width of the bars is 5 mm.

A pattern is established, as shown in FIG. 1. A point A is selected from the inner diameter of the grinding element as the starting point of the bars, $R_i$=100 mm, $R_o$=300 mm. The center circle arc in the refining zone has a radius of 200 mm, $\beta$=45°. A point A is selected, a circle $O_1$ passing through the point A is made by using BE as a tangent line. A tangent line AD passing through the point A, which is tangent to the circle $O_1$, is made. The included angle $\alpha$ between AD and OA is 43.16°. The included angle $\alpha$ is the starting angle of inclination of the $1_{st}$ stage bars. By measurement, the radius of the circle $O_1$ is 205.4 mm. According to the polar coordinates as shown in FIG. 1, an equation of the circle $O_1$ is:

$$\begin{cases} x = 205.4\cos\theta \\ y = 205.4\sin\theta \end{cases} \quad (7)$$

Considering the width of the bars, equations for inner and outer circle arcs for the $1_{st}$ stage bars are:

$$\begin{cases} x = 207.9\cos\theta \\ y = 207.9\sin\theta \end{cases} \text{ and } \begin{cases} x = 202.9\cos\theta \\ y = 202.9\sin\theta \end{cases} \quad (8)$$

The inner and outer circle arcs for the $1_{st}$ stage bars are obtained, as shown in FIG. 2. There are 9 $1_{st}$ stage curved bars arranged on the refiner disc, and edges of the established $1_{st}$ stage bars are shaped in a circular pattern.

As shown in FIG. 4, it is assumed that a starting circle for the $2_{nd}$ stage curved bars has a radius of 140 mm and the starting circle intersects with two adjacent center circle arcs for the $1_{st}$ stage bars at points F and G, and that a center circle in a zone where the $2_{nd}$ stage curved bars are located has a radius of 220 mm and the center circle intersects with two adjacent center circle arcs for the $1_{st}$ stage bars at points H and I.

In this embodiment, FG and HI are equally divided into three parts, with each equal diversion point being a starting point and an intermediate point for the $2_{nd}$ stage curved bars. At an angle of inclination of the bars of 47°, a circle $O_2$ and a circle $O_2'$ passing through the equal division points are made.

By measurement, the circle $O_2$ and the circle $O_2'$ have a radius of 210.38 mm. The point $O_2$ is used as a pole and a horizontal ray is drawn from the pole as a polar axis, the counterclockwise direction is used as the positive direction, and an included angle between a connecting line from any one point on the circle $O_2$ to the pole, and the polar axis is represented as $\theta_1$. The point $O_2'$ is used as a pole and a horizontal ray is drawn from the pole as a polar axis, the counterclockwise direction is used as the positive direction, and an included angle between a connecting line from any one point on the circle $O_2'$ to the pole, and the polar axis is represented as $\theta_1'$. By creating a polar coordinate system by using their circle center as the pole, respectively, the two circle arcs for the $2_{nd}$ stage bars are:

$$\begin{Bmatrix} x = 210.38\cos\theta_1 \\ y = 210.38\sin\theta_1 \end{Bmatrix} \text{ and } \begin{Bmatrix} x = 210.38\cos\theta_1' \\ y = 210.38\sin\theta_1' \end{Bmatrix} \quad (9)$$

then, equations for inner and outer circle arcs for left and right $2_{nd}$ stage bars are:

$$\begin{Bmatrix} x = 207.88\cos\theta_1 \\ y = 207.88\sin\theta_1 \end{Bmatrix}, \begin{Bmatrix} x = 212.88\cos\theta_1 \\ y = 212.88\sin\theta_1 \end{Bmatrix} \quad (10)$$

and $$\begin{Bmatrix} x = 207.88\cos\theta_1' \\ y = 207.88\sin\theta_1' \end{Bmatrix}, \begin{Bmatrix} x = 212.88\cos\theta_1' \\ y = 212.88\sin\theta_1' \end{Bmatrix} \quad (11)$$

There are 9*2=18 $2_{nd}$ stage curved bars arranged on the refiner disc, and edges of the established $1_{st}$ stage bars are shaped in a circular pattern.

As shown in FIG. 7, it is assumed that a starting circle for the $3_{rd}$ stage curved bars has a radius $R_3$ of 200 mm and the starting circle intersects with two adjacent center circle arcs for the $2_{nd}$ stage bars at points J and K, and that a center circle in a zone where the $2_{nd}$ stage curved bars are located has a radius of 250 mm and the center circle intersects with adjacent center circle arcs for the $1_{st}$ stage and $2_{nd}$ stage curved bars at points M and N. In this embodiment, JK and MN are equally divided into two parts, with each equal diversion point being a starting point and an intermediate point for the $2_{nd}$ stage curved bars. At an angle of inclination of the bars of 52°, a circle $O_3$ passing through the equal division points is made.

By measurement, the circle $O_3$ has a radius of 178.69 mm. The point $O_3$ is used as a pole and a horizontal ray is drawn from the pole as a polar axis, the counterclockwise direction is used as the positive direction, and an included angle between a connecting line from any one point on the circle $O_3$ to the pole, and the polar axis is represented as $\theta_2$. By creating a polar coordinate system by using its circle center $O_3$ as the pole, the circle arc for the $3_{rd}$ stage bars is:

$$\begin{Bmatrix} x = 178.69\cos\theta_2 \\ y = 178.69\sin\theta_2 \end{Bmatrix} \quad (12)$$

then, equations for inner and outer circle arcs for $3_{rd}$ stage bars are:

$$\begin{Bmatrix} x = 176.19\cos\theta_2 \\ y = 179.19\sin\theta_2 \end{Bmatrix} \text{ and } \begin{Bmatrix} x = 181.19\cos\theta_2 \\ y = 181.19\sin\theta_2 \end{Bmatrix} \quad (13)$$

There are 27 $3_{rd}$ stage curved bars arranged on the refiner disc, and edges of the established $1_{st}$ stage bars are shaped in a circular pattern.

Figure 12:
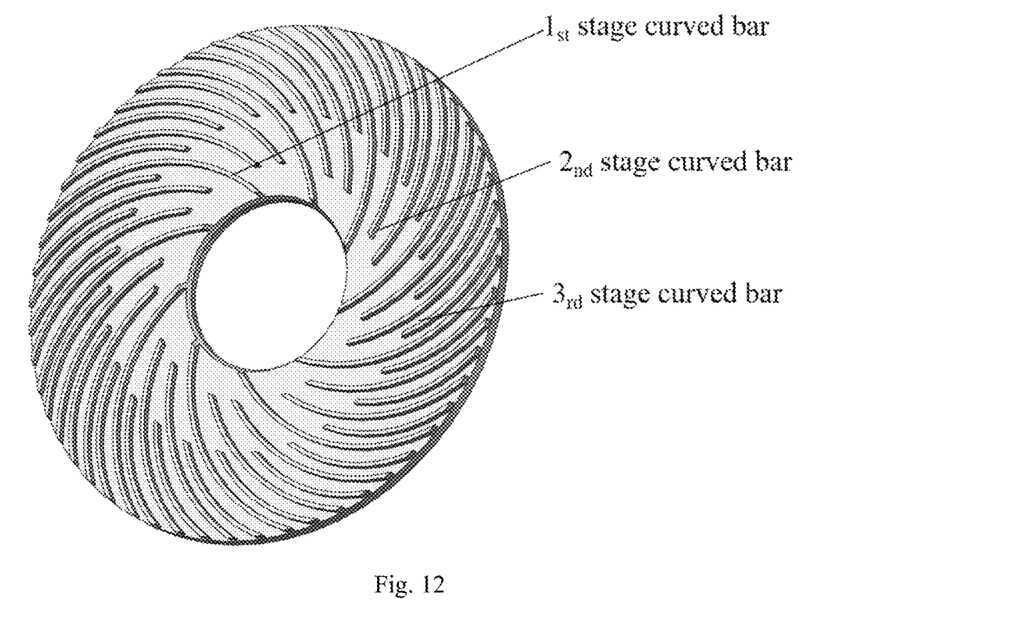
FIG. 12 is a schematic view of a grinding element with three-stage curved bars, in an embodiment of the present invention.

A refiner plate, as shown in FIG. 12, may be finally designed according to the curve equations (7)-(13).

What is claimed is:

1. A method for designing a refiner plate with three-stage radial curved bars, comprising following steps of:
   1) designing a first circle arc for $1_{st}$ stage radial curved bars: defining a first angle of inclination, establishing a center circle arc for the $1_{st}$ stage radial curved bars by the first angle of inclination and a starting position, and establishing a first equation of circle arcs for the $1_{st}$ stage radial curved bars;
   2) designing a second circle arc for $2_{nd}$ stage radial curved bars: defining a second angle of inclination and a radius of a circle where the $2_{nd}$ stage radial curved bars start, dividing the refiner plate into zones, establishing a second equation of circle arcs for the $2_{nd}$ stage radial curved bars, and uniformly distributing the $2_{nd}$ stage radial curved bars between the adjacent $1_{st}$ stage radial curved bars;
   3) designing a third circle arc for $3_{rd}$ stage radial curved bars: defining a third angle of inclination and a radius of a circle where the $3_{rd}$ stage radial curved bars start, dividing the refiner plate into zones, establishing a third equation of circle arcs for the $3_{rd}$ stage radial curved bars, and uniformly distributing the $3_{rd}$ stage radial curved bars between the $1_{st}$ stage radial curved bars and the $2_{nd}$ stage radial curved bars or between the adjacent $2_{nd}$ stage radial curved bars;
   4) dividing the refiner plate into a plurality of segments by designing a center angle for each of the segments according to a size of the refiner plate and manufacture requirements and designing a bar shape of each of the segments according to the center angle for each of the segments; and
   5) machining the refiner plate based on design results obtained in steps 1) to 4.

2. The method for designing a refiner plate with three-stage radial curved bars according to claim 1, wherein the step 1) comprises following steps of:
   step 1: defining the first angle of inclination:
   given that the refiner plate has an inner diameter $R_i$, an outer diameter $R_o$ and a circle center O, a center circle in a refining zone has a radius $(R_i+R_o)/2$, OB is a vertical bisector of the refining zone, and the center circle in the refining zone intersects with OB at a point B, making BE passing through the point B at a top left of OB if the $1_{st}$ stage radial curved bars are left-hand bars and making BE passing through the point B at a top right of OB if the $1_{st}$ stage radial curved bars are right-hand bars, with an included angle between BE and OB being represented by $\beta$, a value of which is preset;

selecting any point A from an inner circle in the refining zone, and making a circle passing through points A and B by using BE as a tangent line, with a line perpendicular to the tangent line BE and a line perpendicular to AD intersecting at a point $O_1$ that is a center of the circle which passes through the points A and B and is tangent to both BE and AD, a radius of the circle $O_1$ being measured as $R_a$; and obtaining an intersected portion of the circle $O_1$ with inner and outer circles in the refining zone as a center line for curved bars, and assuming that an included angle $\beta$ between BE and OB is the first angle of inclination and an included angle $\alpha$ between AD and OA is a starting angle of inclination of the $1_{st}$ stage radial curved bars;

step 2: designing an equation of the center circle arc for the $1_{st}$ stage radial curved bars:

obtaining an equation of the circle $O_1$, by using the point $O_1$ as a pole and drawing a horizontal ray from the pole as a polar axis, using a counterclockwise direction as a positive direction, and representing an included angle between a connecting line from any one point on the circle $O_1$ to the pole, and the polar axis as $\theta$:

$$\begin{cases} x = R_a \cos\theta \\ y = R_a \sin\theta \end{cases}; \qquad (1)$$

wherein the equation (1) is the equation of the circle of the center circle arc AC for the $1_{st}$ stage radial curved bars;

step 3: designing equations for inner and outer circle arcs for the $1_{st}$ stage radial curved bars:

given that a width of the $1_{st}$ stage radial curved bars is b, respectively representing equations for inner and outer circle arcs for the $1_{st}$ stage radial curved bars as $$\begin{cases} x = \left(R_a + \frac{b}{2}\right)\cos\theta \\ y = \left(R_a + \frac{b}{2}\right)\sin\theta \end{cases} \text{ and } \begin{cases} x = \left(R_a - \frac{b}{2}\right)\cos\theta \\ y = \left(R_a - \frac{b}{2}\right)\sin\theta \end{cases}; \qquad (2)$$

step 4: distributing n $1_{st}$ stage radial curved bars according to the size of the refiner plate and process requirements, and shaping edges of the $1_{st}$ stage radial curved bars in a circular pattern, to finally complete a curved design of the $1_{st}$ stage radial curved bars.

3. The method for designing a refiner plate with three-stage radial curved bars according to claim 2, wherein the step 2) comprises following steps of:

step 1: defining the second angle of inclination:

given that a starting circle for the $2_{nd}$ stage radial curved bars has a radius $R_1$ and the starting circle for the $2_{nd}$ stage radial curved bars intersects with two adjacent center circle arcs for the $1_{st}$ stage radial curved bars at points F and G, and given that a center circle in a zone where the 2nd stage radial curved bars are located has a radius $(R_1+R_o)/2$ and the center circle intersects with two adjacent center circle arcs for the $1_{st}$ stage radial curved bars at points H and I, equally dividing FG and HI into m parts with each equal diversion point being a starting point $A_i$ and an intermediate point $B_i$ for the $2_{nd}$ stage radial curved bars, making $B_iE_i$ passing through the intermediate point $B_i$, connecting $OA_i$ and $OB_i$ to obtain an included angle $\beta_i$ between $B_iE_i$ and $OB_i$, and making a circle $O_i$ passing through points $A_i$ and $B_i$ by using $B_iE_i$ as a tangent line, a radius of the circle $O_i$ being measured as $R_b$; and making a tangent line $A_iD_i$ passing through $A_i$ which is tangent to the circle $O_i$, with an included angle $\alpha_i$ between $A_iD_i$ and $OA_i$ being a starting angle of inclination of the $2_{nd}$ stage radial curved bars and an included angle $\beta_i$ between $B_iE_i$ and $OB_i$ being the second angle of inclination;

step 2: designing an equation of a center circle arc for the $2_{nd}$ stage radial curved bars:

obtaining an equation of the center circle arc for the $2_{nd}$ stage radial curved bars, by using a point $O_i$ as a pole and drawing a horizontal ray from the pole as a polar axis, using the counterclockwise direction as the positive direction, and representing an included angle between a connecting line from any one point on the circle $O_i$ to the pole, and the polar axis as $\theta_1$:

$$\begin{cases} x = R_b \cos\theta_1 \\ y = R_b \sin\theta_1 \end{cases}; \qquad (3)$$

step 3: designing equations for inner and outer circle arcs for the $2_{nd}$ stage radial curved bars:

given that a width of the $2_{nd}$ stage radial curved bars is a, respectively representing equations for inner and outer circle arcs for the $2_{nd}$ stage radial curved bars as:

$$\begin{cases} x = \left(R_b + \frac{a}{2}\right)\cos\theta_1 \\ y = \left(R_b + \frac{a}{2}\right)\sin\theta_1 \end{cases} \text{ and } \begin{cases} x = \left(R_b - \frac{a}{2}\right)\cos\theta_1 \\ y = \left(R_b - \frac{a}{2}\right)\sin\theta_1 \end{cases}; \qquad (4)$$

step 4: according to the number n of the $1_{st}$ stage radial curved bars, shaping edges of the $2_{nd}$ stage radial curved bars in a circular pattern, with the number of the $2_{nd}$ stage radial curved bars being n(m−1), to finally complete a curved design of the $2_{nd}$ stage radial curved bars.

4. The method for designing a refiner plate with three-stage radial curved bars according to claim 3, wherein the step 3) comprises following steps of:

step 1: defining the third angle of inclination:

given that a starting circle for the $3_{rd}$ stage radial curved bars has a radius $R_2$ and the starting circle for the $3_{rd}$ stage radial curved bars intersects with two adjacent center circle arcs for the $1_{st}$ stage radial curved bars or with adjacent center circle arcs for the $1_{st}$ stage and $2_{nd}$ stage radial curved bars at points J and K, and given that a center circle in a zone where the $3_{rd}$ stage radial curved bars are located has a radius $(R_2+R_o)/2$ and the center circle intersects with two adjacent center circle arcs for the $2_{nd}$ stage radial curved bars or with adjacent center circle arcs for the $1_{st}$ stage and $2_{nd}$ stage radial curved bars at points M and N, equally dividing JK and MN into z parts with each equal diversion point being a starting point $A_x$ and an intermediate point $B_X$ for the $3_{rd}$ stage radial curved bars, making $B_xE_x$ passing through the intermediate point $B_x$, connecting $OA_x$ and $OB_x$ to obtain an included angle $\beta_x$ between $B_xE_x$ and $OB_x$, and making a circle $O_x$ passing through the point $A_x$ by using $B_xE_x$ as a tangent line, a radius of the circle $O_x$ being measured as $R_c$; and making a tangent line $A_xD_x$ passing through $A_x$, which is tangent to the circle $O_x$, with an included angle $\alpha_x$ between $A_xD_x$ and $OA_x$ being a starting angle of inclination of the $3_{rd}$ stage radial curved bars and an included angle $\beta_i$ between $B_iE_i$ and $OB_i$ being the third angle of inclination;

step 2: designing an equation of a center circle arc for the $3_{rd}$ stage radial curved bars:

obtaining an equation of the center circle arc for the $3_{rd}$ stage radial curved bars, by using a point $O_x$ as a pole and drawing a horizontal ray from the pole as a polar axis, using the counterclockwise direction as the positive direction, and representing an included angle between a connecting line from any one point on the circle $O_x$ to the pole, and the polar axis as $\theta_2$:

$$\begin{cases} x = R_c\cos\theta_2 \\ y = R_c\sin\theta_2 \end{cases}; \quad (5)$$

step 3: designing equations for inner and outer circle arcs for the $3_{rd}$ stage radial curved bars:

given that the width of the $3_{rd}$ stage radial curved bars is c, respectively representing equations for inner and outer circle arcs for the $3_{rd}$ stage radial curved bars as:

$$\begin{cases} x = \left(R_c + \dfrac{c}{2}\right)\cos\theta_2 \\ y = \left(R_c + \dfrac{c}{2}\right)\sin\theta_2 \end{cases} \text{ and } \begin{cases} x = \left(R_c - \dfrac{c}{2}\right)\cos\theta_2 \\ y = \left(R_c - \dfrac{c}{2}\right)\sin\theta_2 \end{cases}; \quad (6)$$

step 4: according to the number n of the $1_{st}$ stage radial curved bars and the number n(m−1) of the $2_{nd}$ stage radial curved bars, shaping edges of the $3_{rd}$ stage radial curved bars in a circular pattern, with the number of the $3_{rd}$ stage radial curved bars being nm(z−1), to finally complete a curved design of the $3_{rd}$ stage radial curved bars.

5. The method for designing a refiner plate with three-stage radial curved bars according to claim 1, wherein the first angle of inclination is less than the second angle of inclination, and the second angle of inclination is less than the third angle of inclination.

6. The method for designing a refiner plate with three-stage radial curved bars according to claim 5, wherein the first angle of inclination, the second angle of inclination or the third angle of inclination ranges from 35° to 55°.

* * * * *